(12) United States Patent
Clough et al.

(10) Patent No.: US 8,835,915 B2
(45) Date of Patent: Sep. 16, 2014

(54) ASSEMBLY AND ELECTRONIC DEVICES INCLUDING THE SAME

(75) Inventors: Robert S. Clough, St. Paul, MN (US); James C. Novack, Hudson, WI (US); David H. Redinger, Aston, MN (US); Guoping Mao, Woodbury, MN (US); Michael E. Griffin, Maplewood, MN (US)

(73) Assignee: 3M Innovative Properties Company, St. Paul, MN (US)

( * ) Notice: Subject to any disclaimer, the term of this patent is extended or adjusted under 35 U.S.C. 154(b) by 0 days.

(21) Appl. No.: 13/880,914

(22) PCT Filed: Nov. 17, 2011

(86) PCT No.: PCT/US2011/061199
§ 371 (c)(1),
(2), (4) Date: May 31, 2013

(87) PCT Pub. No.: WO2012/071243
PCT Pub. Date: May 31, 2012

(65) Prior Publication Data
US 2013/0256640 A1    Oct. 3, 2013

Related U.S. Application Data

(60) Provisional application No. 61/415,975, filed on Nov. 22, 2010.

(51) Int. Cl.
*H01L 51/05* (2006.01)
*H01L 51/00* (2006.01)

(52) U.S. Cl.
CPC ......... *H01L 51/0537* (2013.01); *H01L 51/0055* (2013.01); *H01L 51/052* (2013.01); *H01L 51/0094* (2013.01); *H01L 51/004* (2013.01)

USPC ............... 257/40; 257/E51.005; 257/E51.007

(58) Field of Classification Search
USPC ........................... 257/40, E51.005, E51.007
See application file for complete search history.

(56) References Cited

U.S. PATENT DOCUMENTS

| | | | |
|---|---|---|---|
| 4,262,072 | A | 4/1981 | Wendling |
| 5,739,254 | A | 4/1998 | Fuller |
| 6,864,396 | B2 | 3/2005 | Smith |
| 6,955,939 | B1 | 10/2005 | Lyons |
| 6,974,877 | B2 | 12/2005 | Vogel |
| 6,998,068 | B2 | 2/2006 | Gerlach |
| 7,109,519 | B2 | 9/2006 | Gerlach |
| 7,241,437 | B2 | 7/2007 | Davidson |

(Continued)

FOREIGN PATENT DOCUMENTS

| | | |
|---|---|---|
| WO | WO 2009/155106 | 12/2009 |
| WO | WO 2009/158201 | 12/2009 |
| WO | WO 2010/056568 | 5/2010 |

OTHER PUBLICATIONS

International Search Report, Internat. Appl. No. PCT/US2001/061199, mailed Jun. 15, 2012.

*Primary Examiner* — Minh-Loan T Tran
(74) *Attorney, Agent, or Firm* — Bradford B. Wright

(57) ABSTRACT

An assembly includes a dielectric layer in contact with a semiconductor layer. The dielectric layer includes a crosslinked polymeric material having isocyanurate groups, wherein the dielectric layer is free of zirconium oxide particles. The semiconductor layer includes a non-polymeric organic semiconductor material, and is substantially free of electrically insulating polymer. Electronic components and devices including the assembly are also disclosed.

4 Claims, 2 Drawing Sheets

(56) References Cited

U.S. PATENT DOCUMENTS

| | | |
|---|---|---|
| 7,264,872 B2 | 9/2007 | Walker, Jr. |
| 2006/0027860 A1 | 2/2006 | Nomoto |
| 2006/0199886 A1 | 9/2006 | Ryang |
| 2007/0012922 A1 | 1/2007 | Harada |
| 2007/0126002 A1 | 6/2007 | Moriya |
| 2008/0067505 A1 | 3/2008 | Lee |
| 2008/0197345 A1 | 8/2008 | Kim |
| 2008/0311308 A1 | 12/2008 | Lee |
| 2009/0001356 A1 | 1/2009 | Novack |
| 2009/0004771 A1 | 1/2009 | Novack |

ASSEMBLY AND ELECTRONIC DEVICES INCLUDING THE SAME

BACKGROUND

Many electronic devices include components that include semiconductors; for example, components that have a semiconductor layer in contact with a dielectric layer. For example, a semiconductor layer and a dielectric layer commonly termed a "gate dielectric" may be part of a Thin Film Transistor (TFT).

Both the physical and chemical nature of the gate dielectric is thought to influence the electronic performance of the organic semiconductor at the interface with the gate dielectric. This interface is critical to performance as charge is transported from source electrode to drain electrode through the organic semiconductor along this interface when the organic TFT (OTFT) is in the ON state, that is when a certain gate to source voltage bias has been reached or exceeded and the drain current has risen exponentially. Thus, gate dielectrics are sought that enable superior electronic performance, such as high charge carrier mobility, high ON/OFF current ratio, low OFF current, and small sub-threshold slope in combination with organic semiconductors.

One area of improvement needed for the implementation of OTFTs in commercial products is more consistent or repeatable electronic performance between OTFTs fabricated in an identical manner, and more consistent or repeatable performance of the same OTFT from cycle to cycle. Less hysteresis in the OTFTs during their operation is sought. Hysteresis may result during driving of the OTFTs due to various factors including charges being trapped and accumulated between the organic semiconductor and the gate dielectric, or temporary polarization of the gate dielectric, or moisture being absorbed by the gate dielectric.

SUMMARY

In one aspect, the present disclosure provides an assembly comprising:
a dielectric layer comprising a crosslinked polymeric material having isocyanurate groups, wherein the dielectric layer is free of zirconium oxide particles; and
a semiconductor layer in contact with the dielectric layer, wherein the semiconductor layer comprises a non-polymeric organic semiconductor material, wherein the semiconductor layer is substantially free of electrically insulating polymer, and wherein.

Assemblies according to the present disclosure are useful, for example, in electronic components and devices.

Accordingly, electronic devices comprising an assembly according to the present disclosure are also provided.

In yet another aspect, the present disclosure provides an organic thin film transistor comprising:
a gate electrode;
a source electrode;
a drain electrode;
an assembly according to the present disclosure, wherein the gate electrode is adjacent to the dielectric layer, and wherein the source electrode and the drain electrode are adjacent to the semiconductor layer.

In yet another aspect, the present disclosure provides an organic thin film transistor comprising:
a gate electrode;
an inorganic oxide layer;
a source electrode;
a drain electrode;
an assembly according to the present disclosure, wherein the inorganic oxide layer is sandwiched between the gate electrode and the dielectric layer, and wherein the source electrode and the drain electrode are adjacent to the semiconductor layer.

As used herein,
"(meth)acryl" refers to acryl and/or methacryl; and
"isocyanurate group" refers to a heterocyclic group represented by the structure:

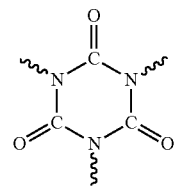

wherein ⁓ refers to a site available for covalent bond formation.

The features and advantages of the present disclosure will be further understood upon consideration of the detailed description as well as the appended claims.

While the above-identified figures set forth several exemplary embodiments of the present disclosure, other embodiments are also contemplated, as noted in the discussion. In all cases, this disclosure presents the disclosure by way of representation and not limitation. The figures may not be drawn to scale.

DETAILED DESCRIPTION

Figure 1:
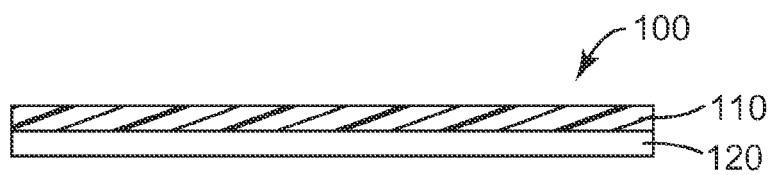
FIG. 1 is a schematic side view of an exemplary assembly according to the present disclosure.

Referring now to FIG. 1, exemplary assembly 100 comprises a dielectric layer 110 and a semiconductor layer 120 in contact with dielectric layer 110.

Dielectric layer 110 comprises a crosslinked polymeric material having isocyanurate groups, wherein the dielectric layer is free of zirconium oxide particles. The crosslinked polymeric material having isocyanurate groups can be any polymeric material having isocyanurate groups. Examples include polymerized polymerizable compositions, wherein the polymerizable composition comprises at least one compound having: at least one isocyanurate group and at least one polymerizable group such as, for example, an epoxy group, an isocyanate group (—N=C=O), a hydrolyzable silane group (for example, —Si(OR)$_3$ wherein R is $C_1$-$C_4$ alkyl or $C_1$-$C_4$ acyl), a free-radically polymerizable group (for example, a (meth)acryloyl group), and/or a combination thereof. The polymerizable compositions may also comprise additional polymerizable materials that do not contain an isocyanurate group. Examples include epoxy resins, polyisocyanates, hydrolyzable silanes, (meth)acrylates, and combinations thereof. Other functional groups that are amenable to polymerization methods such as, for example, condensation polymerization may also be used. The choice of additional polymerizable materials, curatives/initiators, and type of polymerization will be apparent to those of skill in the art. To ensure crosslinking, it is generally desirable that at least one polymerizable component of polymerizable composition is polyfunctional (that is, it has at least two polymerizable groups).

One exemplary epoxy resin that has isocyanurate groups is tris(2,3-epoxypropyl)-isocyanurate also known as triglycidyl isocyanurate, which is available commercially from numerous sources. Useful epoxy resins may contain combinations of epoxy compounds, only some of which have an isocyanurate group. Curatives for epoxy resins may include, for example, amines, amidines (for example, dicyandiamide), and thiols.

Polyisocyanates having isocyanurate groups are available commercially; for example, as a hexamethylene diisocyanate trimer available as DESMODUR N3300 from Bayer Corporation USA of Pittsburgh, Pa. Useful polyisocyanates may contain, for example, combinations of polyisocyanate compounds, wherein only some of which have an isocyanurate group. Curatives for polyisocyanates may include, for example, polyamines, polyols, and moisture.

An exemplary compound having hydrolyzable silane groups and an isocyanurate group is tris(3-trimethoxysilylpropyl)isocyanurate, which is available commercially from Gelest, Inc. of Tullytown, Pa. Compounds having hydrolyzable silane groups are typically moisture-curable.

Exemplary free-radically polymerizable isocyanurate group-containing compounds include tris(2-hydroxyethyl) isocyanurate triacrylate (also referred to as tris(2-acryloyloxyethyl)isocyanurate), available as SR368 from Sartomer Co. of Exton, Pa.; and triallyl isocyanurate, available from Eastar Chemical Corporation of Sacramento, Calif. Thermal initiator(s) and/or photoinitiator(s) and/or electron beam radiation may be useful in initiating free-radical polymerization.

Similarly, isocyanurate groups may be incorporated in curing agents for epoxy resins, (meth)acrylic resins, and/or polyisocyanates such as, for example, tris(aminoethyl)isocyanurate, tris(aminopropyl)isocyanurate, tris(aminohexyl) isocyanurate.

Exemplary, free-radically polymerizable compounds that can be copolymerized with the free-radically polymerizable isocyanurate group-containing compounds include mono (meth)acrylates and multifunctional (meth)acrylates such as, for example, di(meth)acrylate, tri(meth)acrylates, tetra (meth)acrylates, penta(meth)acrylates, and oligomeric poly (meth)acrylates.

Examples of mono(meth)acrylates include $C_{12}$-$C_{14}$ methacrylates, isodecyl acrylate, 2-ethoxyethyl acrylate, tetrahydrofurfuryl acrylate, caprolactone acrylate, isobornyl acrylate, and epoxy acrylates.

Examples of di(meth)acrylates include 1,3-butylene glycol diacrylate, 1,4-butanediol diacrylate, 1,6-hexanediol diacrylate, 1,6-hexanediol monoacrylate monomethacrylate, ethylene glycol diacrylate, alkoxylated aliphatic diacrylate, alkoxylated cyclohexanedimethanol diacrylate, alkoxylated hexanediol diacrylate, alkoxylated neopentyl glycol diacrylate, caprolactone modified neopentyl glycol hydroxypivalate diacrylate, cyclohexanedimethanol diacrylate, diethylene glycol diacrylate, dipropylene glycol diacrylate, ethoxylated (10) bisphenol A diacrylate, ethoxylated (3) bisphenol A diacrylate, ethoxylated (30) bisphenol A diacrylate, ethoxylated (4) bisphenol A diacrylate, ethoxylated (4) bisphenol A dimethacrylate, hydroxypivalaldehyde modified trimethylolpropane diacrylate, neopentyl glycol diacrylate, polyethylene glycol (200) diacrylate, polyethylene glycol (400) diacrylate, polyethylene glycol (600) diacrylate, propoxylated neopentyl glycol diacrylate, tetraethylene glycol diacrylate, tricyclodecanedimethanol diacrylate, triethylene glycol diacrylate, and tripropylene glycol diacrylate.

Examples of tri(meth)acrylates include glycerol triacrylate, trimethylolpropane triacrylate, ethoxylated triacrylates (for example, ethoxylated (3) trimethylolpropane triacrylate, ethoxylated (6) trimethylolpropane triacrylate, ethoxylated (9) trimethylolpropane triacrylate, ethoxylated (15) trimethylolpropane triacrylate, ethoxylated (20) trimethylolpropane triacrylate), pentaerythritol triacrylate, propoxylated triacrylates (for example, propoxylated (3) glyceryl triacrylate, propoxylated (5.5) glyceryl triacrylate, propoxylated (3) trimethylolpropane triacrylate, propoxylated (6) trimethylolpropane triacrylate), and trimethylolpropane triacrylate.

Examples of higher functionality (meth)acrylic compounds include ditrimethylolpropane tetraacrylate, dipentaerythritol pentaacrylate, ethoxylated (4) pentaerythritol tetraacrylate, pentaerythritol tetraacrylate, and caprolactone modified dipentaerythritol hexaacrylate.

Examples of oligomeric polymerizable (meth)acrylic compounds include urethane acrylates, polyester acrylates, and epoxy acrylates. Additional useful (meth)acrylate materials include hydantoin moiety-containing poly(meth)acrylates, for example, as described in U.S. Pat. No. 4,262,072 (Wendling et al.).

Desirably, the polymerizable composition comprises at least 50, 65, 75, 80, 85, 90, 95, or even at least 99 weight percent of the free-radically polymerizable isocyanurate monomer, based on a total weight of free-radically polymerizable compounds in the polymerizable composition.

In each of the above cases, at least some polymerizable material should have more than one polymerizable group per molecule such that crosslinking occurs.

The polymerizable composition typically includes an effective amount of an appropriate initiator and/or curative such that polymerization will occur, the selection of which will be readily apparent to those of skill in the art, and will depend on the chemical nature of the polymerizable composition.

If the polymerizable composition is free-radically polymerizable (for example) as in the case of polymerizable (meth)acrylic resins, thermal and/or photoinitiators may be included in the polymerizable composition. Exemplary thermal initiators including azo compounds (such as 2,2'-azobisisobutyronitrile (AIBN), 2,2'-azobis(2-methylbutyro-nitrile), 2,2'-azobis(2,4-dimethylvaleronitrile), and peroxide compounds (such as benzoyl peroxide or lauroyl peroxide) can be used. Exemplary photoinitiators include as 1-hydroxycyclohexylphenyl ketone, 2-hydroxy-2-methyl-1-phenyl-1-propanone, α,α-dimethoxy-α-phenylacetophenone, and phenyl bis(2,4,6-trimethylbenzoyl)phosphine oxide. Typically, the polymerization initiator (whether a thermal initiator or a photoinitiator) is used in an amount of from about 0.1 percent to about 20 percent by weight, more typically from about 1 percent to about 5 percent by weight, based on the total weight of the dielectric layer, although this is not a requirement.

Optionally, the polymerizable composition and/or the resulting crosslinked polymeric material may contain additives such as, for example, inhibitors, wetting agents, rheology modifiers, fillers, colorants, and light stabilizers.

To form the dielectric layer, the polymerizable composition may be deposited onto a substrate using any liquid deposition technique. The substrate can be a substrate that supports the entire electronic device (the "device substrate") or another layer or feature of the device. For example, it may be deposited on a gate electrode or an inorganic oxide layer, such as silicon dioxide or alumina on the gate electrode. The polymerizable composition can be deposited, for example, by spin coating, dip coating, meniscus coating, gravure coating, or printing techniques such as inkjet printing, and flexographic printing.

The polymerizable composition can be deposited neat or dissolved or dispersed in solvent to form a coating composition. In general, any solvent (for example, organic solvent) that is compatible with the resin can be utilized. The selection of a solvent and its amount typically depends on the liquid deposition technique to be utilized and the thickness of the layer of the polymerizable composition to be deposited. The amount of solvent utilized can be used to control the viscosity of the coating composition. Suitable viscosity ranges, however, typically depend upon the method by which the coating composition is deposited, because of the wide range of shear rates associated with different methods.

After the deposition of the coating composition, the coating composition can be dried to remove some or all of the solvent to leave the polymerizable composition with or without solvent. After drying, desirably the polymerizable composition contains less than 5 percent by weight solvent.

Polymerization and crosslinking of the polymerizable composition may generally be effected using energy such as, for example, thermal energy, microwave energy, ultraviolet light (UV), visible light, and/or particulate radiation (for example, electron beam radiation). In some embodiments, the polymerizable composition is polymerized via a free-radical photopolymerization mechanism. In such a case, polymerization is typically performed under an inert gas such as, for example, nitrogen. The energy dose typically depends on the thickness and composition of the dielectric layer.

In some embodiments, the dielectric layer is substantially free of, or free of, inorganic oxide particles. As used herein, the term "substantially free of inorganic oxide particles" means that the dielectric layer contains less than 3 percent by weight of inorganic oxide particles.

The dielectric layer can be patterned, for example, by using inkjet printing or masking techniques. To pattern using masking techniques, a layer of polymerizable composition can be deposited as described above. Then, the layer can be patterned by exposing predetermined regions of the layer to UV light through a photomask, which permits the light to pass only in accordance with the desired pattern. Only the regions that are exposed to the light will cure. The non-polymerized regions can then be removed (for example, with solvents).

Semiconductor layer 120 comprises a non-polymeric organic semiconductor material. Useful organic semiconductor materials include acenes, heteroacenes and substituted derivatives thereof. Particular examples of acenes include anthracene, naphthalene, tetracene, pentacene, and substituted pentacenes. Another example includes perylenes and substituted derivatives. Useful bis-(2-acenyl)acetylene semiconductor materials are described in U.S. Pat. No. 7,109,519 (Gerlach). Useful acene-thiophene semiconductor materials are described in U.S. Pat. No. 6,998,068 (Gerlach).

Substituted derivatives of acenes include acenes substituted with at least one electron-donating group, halogen atom, or a combination thereof, or a benzo-annellated acene or polybenzo-annellated acene, which optionally is substituted with at least one electron-donating group, halogen atom, or a combination thereof. The electron-donating group is selected from an alkyl, alkoxy, or thioalkoxy group having from 1 to 24 carbon atoms. Exemplary alkyl groups include methyl, ethyl, n-propyl, isopropyl, n-butyl, sec-butyl, n-pentyl, n-hexyl, n-heptyl, 2-methylhexyl, 2-ethylhexyl, n-octyl, n-nonyl, n-decyl, n-dodecyl, n-octadecyl, and 3,5,5-trimethylhexyl. Substituted pentacenes and methods of making them are taught in U.S. Pat. No. 6,974,877 (Vogel et al.) and U.S. Pat. No. 6,864,396 (Smith et al.).

Other examples of useful organic semiconductor materials include fullerenes, phthalocyanines, metallophthalocyanines and substituted derivatives.

Desirably, the semiconductor material is one that can be solution-deposited. Examples of suitable semiconductor materials that can be solution-deposited include:

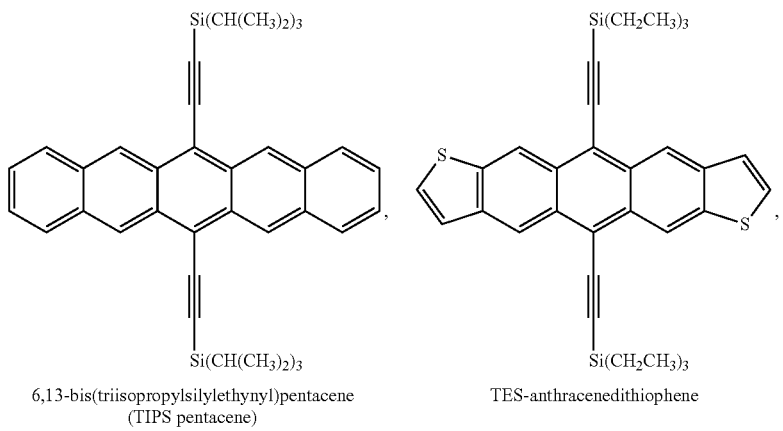

6,13-bis(triisopropylsilylethynyl)pentacene (TIPS pentacene)

TES-anthracenedithiophene

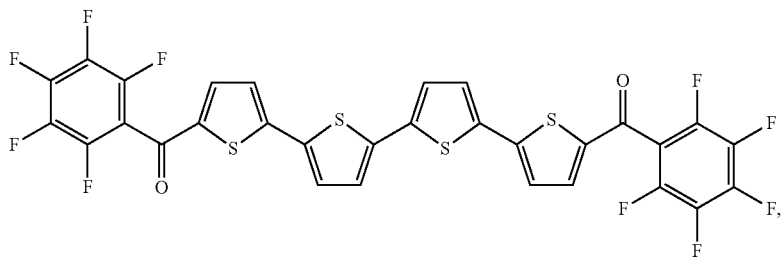

DFHCO-4T

-continued

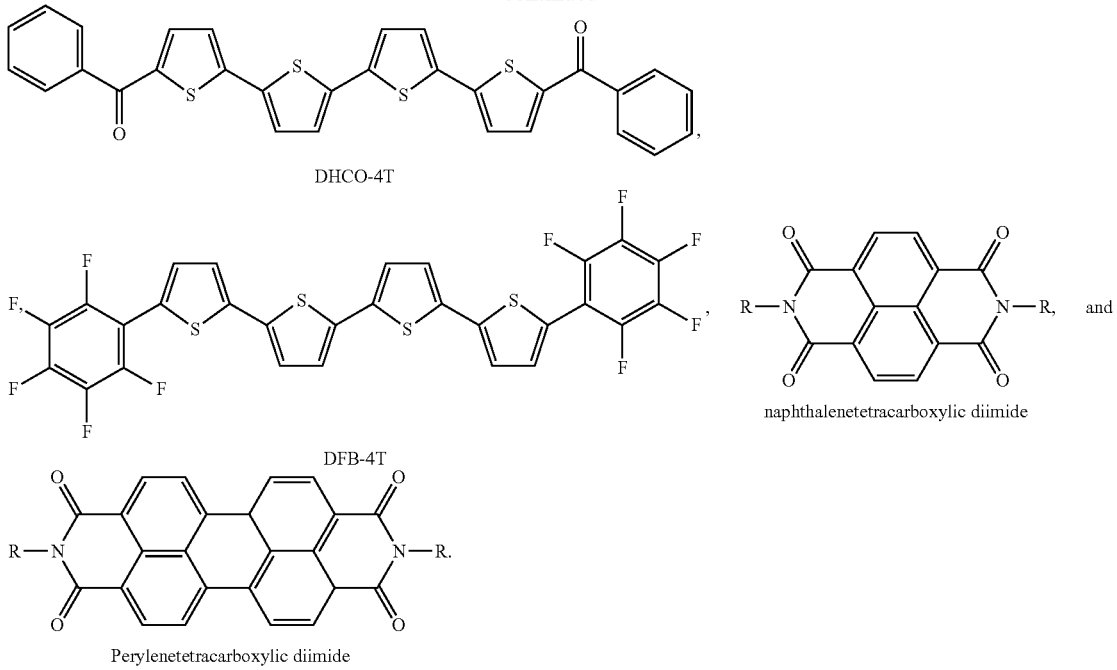

Additional suitable semiconductor materials include: 6,13-bis(isopropenyldiisopropylsilylethynyl)pentacene, 6,13-bis(allyldiisopropylsilylethynyl)pentacene, 6,13-bis(cyclopropyldiisopropylsilylethynyl)pentacene, 6,13-bis((1-methylenepropyl)diisopropylsilylethynyl)pentacene, 6,13-bis(cyclopropyldiisopropylsilylethynyl)-2,3,9,10-tetramethyl-pentacene, 6,13-bis(allyldicyclopropylsilylethynyl)pentacene, and organic semiconductors as described in PCT Published Appln. Nos. WO 2009/155106 A1 (Anthony et al.) and WO 2009/158201 A1 (Clough et al.), the relevant disclosures of which are incorporated herein by reference. Desirably, the semiconductor layer comprises silylethynyl-substituted pentacenes (for example, TIPS pentacene).

The semiconductor layer is substantially free of electrically insulating polymers. In some embodiments, the semiconductor layer is free of electrically insulating polymers. Examples of electrically insulating polymers include polystyrene, poly(alpha-methyl-styrene), polymethyl methacrylate, polyethylene, polypropylene, and polyethylene terephthalate. As used herein, the phrase "substantially free of electrically insulating polymer" means containing less than three percent by weight of electrically insulating polymer based on the total weight of the semiconductor layer.

The semiconductor layer can be provided by any useful means such as, for example, liquid deposition, such as solution deposition, or vapor deposition (desirably, by solution deposition). Liquid and solution deposition techniques can include spin coating, dip coating, die coating, roll coating, gravure coating, and printing techniques. Patterning of the semiconductor layer can be accomplished by known methods such as aperture masking, additive photolithography, subtractive photolithography, pattern coating, and printing, such as inkjet printing, microcontact printing, and flexographic printing (desirably, by printing).

Dielectric layer/semiconductor layer assemblies according to the present disclosure are useful, for example, in various types of electronic devices such as transistors (for example, junction transistors or thin film transistors), diodes (for example, light emitting diodes), photovoltaic cells, sensors, and displays. The remaining features and layers of the electronic device can be fabricated, for example, using appropriate and well known methods.

Thin film transistors (TFTs) are a particularly useful type of electronic device. TFTs generally include a transistor substrate, a gate electrode, a gate dielectric (corresponding to the dielectric layer of the present disclosure), a source electrode, and a drain electrode, and a semiconductor layer (corresponding to the semiconductor layer of the present disclosure) adjacent to the gate dielectric and adjacent to the source and drain electrodes. These components can be assembled in a variety of configurations. For example, the source and drain electrodes can be adjacent to the gate dielectric with the semiconductor layer over the source and drain electrodes, or the semiconductor layer can be interposed between the source and drain electrodes and the gate dielectric. More specifically, a TFT can be configured as (1) a bottom gate, bottom contact TFT, (2) a top gate, top contact TFT, (3) a bottom gate, top contact TFT, or (4) a top gate, bottom contact TFT.

Figure 2A:
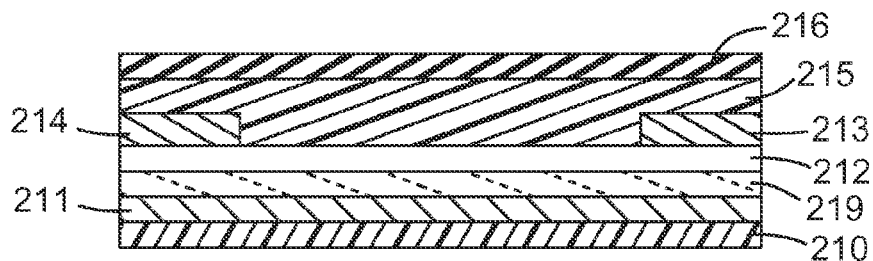
FIGS. 2A-2D are schematic cross-sectional views of embodiments of exemplary thin film transistors.

FIG. 2A illustrates a bottom gate, bottom contact TFT. Gate electrode 211 is disposed on a transistor substrate 210. Dielectric layer 212 (a gate dielectric) is disposed on gate electrode 211 or on optional inorganic oxide layer 219, which if present is sandwiched between gate electrode 211 and dielectric layer 212. Patterned source and drain electrodes 213, 214 are disposed on dielectric layer 212. Semiconductor layer 215 is disposed on source and drain electrodes 213, 214 and dielectric layer 212. Optionally, an encapsulant layer 216 can be disposed on semiconductor layer 215.

Figure 2B:
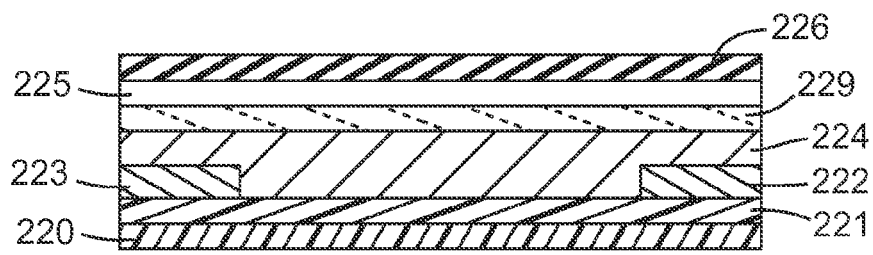

FIG. 2B illustrates a top gate, top contact TFT. Semiconductor layer 221 is disposed on a transistor substrate 220. Patterned source and drain electrodes 222, 223 are disposed on semiconductor layer 221. Dielectric layer 224 (a gate dielectric) is disposed on source and drain electrodes 222, 223 and semiconductor layer 221. Gate electrode 225 is disposed on dielectric layer 224, or on optional inorganic oxide layer 229, which if present is sandwiched between gate electrode 225 and dielectric layer 224. Optionally, an encapsulant layer 226 can be disposed on gate electrode 225.

Figure 2C:
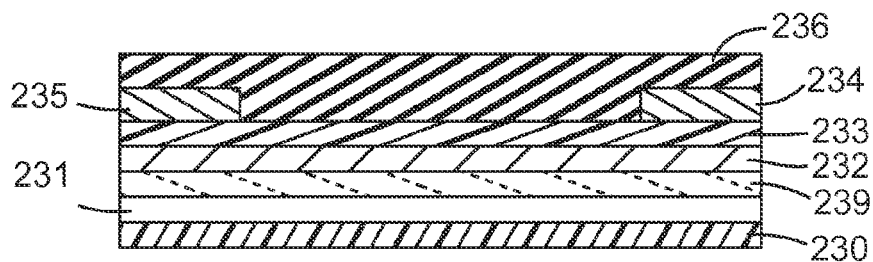

FIG. 2C illustrates a bottom gate, top contact TFT. Gate electrode 231 is disposed on a transistor substrate 230. Dielectric layer 232 (a gate dielectric) is disposed on gate electrode 231 or on optional inorganic oxide layer 239, which if present is sandwiched between gate electrode 231 and dielectric layer 232. Semiconductor layer 233 is disposed on dielectric layer 232. Patterned source and drain electrodes 234, 235 are disposed on semiconductor layer 233. Optional encapsulant layer 236 is disposed on source and drain electrodes 234, 235 and semiconductor layer 233.

Figure 2D:
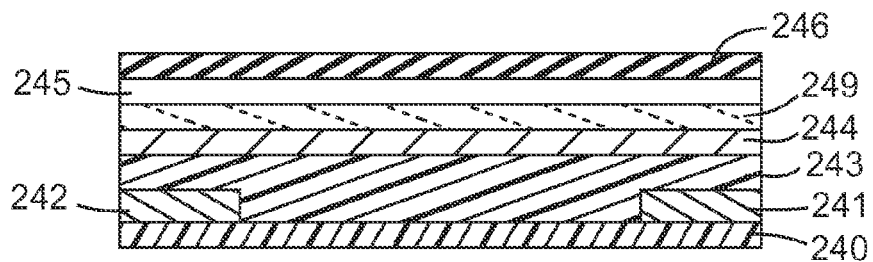

FIG. 2D illustrates a top gate, bottom contact TFT. Patterned source and drain electrodes 241, 242 are disposed on a transistor substrate 240. Semiconductor layer 243 is disposed on source and drain electrodes 241, 242 and substrate 240. Dielectric layer 244 (a gate dielectric) is disposed on semiconductor layer 243. Gate electrode 245 is disposed on dielectric layer 244 or on optional inorganic oxide layer 249, which if present is sandwiched between gate electrode 245 and dielectric layer 244. Optional encapsulant layer 246 is disposed on gate electrode 245.

The optional inorganic layer may include inorganic oxides such as, for example, oxides of silicon (for example, $SiO_2$) or oxides of aluminum (for example, $Al_2O_3$).

TFTs made according to the present disclosure can be provided on a substrate (the "transistor substrate"). The transistor substrate typically supports the TFT during manufacturing, testing, and/or use. For example, one transistor substrate may be selected for testing or screening various embodiments while another transistor substrate is selected for commercial embodiments. Optionally, the transistor substrate can provide an electrical function for the TFT. Useful transistor substrate materials include organic and inorganic materials. For example, the transistor substrate can comprise inorganic glasses, ceramic foils, polymeric materials (for example, acrylics, epoxies, polyamides, polycarbonates, polyimides, polyketones, poly(oxy-1,4-phenyleneoxy-1,4-phenylenecarbonyl-1,4-phenylene) (sometimes referred to as poly(ether ether ketone) or PEEK), polynorbornenes, polyphenylene oxides, poly(ethylene naphthalate) (PEN), poly(ethylene terephthalate) (PET), poly(phenylene sulfide) (PPS)), filled polymeric materials (for example, fiber-reinforced plastics (FRP)), fibrous materials, such as paper and textiles, and coated or uncoated metallic foils. Desirably, the transistor substrate comprises a polymeric material.

A flexible transistor substrate can be used. A flexible transistor substrate allows for roll processing, which may be continuous, providing economy of scale and economy of manufacturing over flat and/or rigid substrates. The flexible transistor substrate chosen desirably is capable of wrapping around the circumference of a cylinder of less than about 50 cm diameter (desirably, less than about 25 cm diameter; more desirably, less than about 10; most desirably, less than about 5 cm) without distorting or breaking. The force used to wrap the flexible transistor substrate of the disclosure around a particular cylinder typically is low, such as by unassisted hand (that is, without the aid of levers, machines, hydraulics, and the like).

The gate electrode of a TFT can be any useful conductive material. For example, the gate electrode can comprise doped silicon, or a metal, such as aluminum, copper, chromium, gold, silver, nickel, palladium, platinum, tantalum, and titanium, and transparent conducting oxides such as indium tin oxide or a doped zinc oxide (for example, aluminum doped zinc oxide or gallium doped zinc oxide). Conductive polymers also can be used such as, for example, polyaniline or poly(3,4-ethylenedioxythiophene)/-poly(styrene sulfonate) (PEDOT:PSS). In addition, alloys, combinations, and multiple layers of these materials can be useful. In some TFTs, the same material can provide the gate electrode function and also provide the support function of a transistor substrate. For example, doped silicon can function as the gate electrode and support the TFT.

The gate dielectric electrically insulates the gate electrode from the balance of the TFT device. The gate dielectric desirably has a relative dielectric constant above about 2 (more desirably, above about 3). Dielectric layers according to the present disclosure are useful as the gate dielectric of a TFT.

The source and drain electrodes of a TFT can be any useful conductive material. Useful materials include, for example, aluminum, barium, chromium, copper, gold, silver, nickel, palladium, platinum, titanium, transparent conducting oxides such as indium tin oxide or a doped zinc oxide (for example, aluminum doped zinc oxide or gallium doped zinc oxide), polyaniline, PEDOT:PSS, other conducting polymers, alloys thereof, combinations thereof, and multiple layers thereof.

The TFT electrodes (that is, the gate electrode, source electrode, and drain electrode) can be provided by any useful means such as, for example, by plating, inkjet printing, or vapor deposition (for example, thermal evaporation or sputtering). Patterning of the thin film electrodes can be accomplished by known methods such as aperture masking, additive photolithography, subtractive photolithography, printing, microcontact printing, and pattern coating.

The optional inorganic oxide layer can be provided by any useful means such as, for example, thermal oxidation or electrochemical oxidation of the surface of the gate electrode, e-beam evaporation of an inorganic oxide onto the gate electrode, chemical vapor deposition onto the gate electrode, or sputtering onto the gate electrode. Patterning of the inorganic oxide layer can be accomplished by known methods such as aperture masking, additive photolithography, or subtractive photolithography.

A plurality of TFTs can be interconnected to form an integrated circuit (IC). Integrated circuits include but are not limited to, for example, ring oscillators, radio-frequency identification (RFID) circuitry, logic elements, amplifiers, and clocks. Therefore, TFTs of the present disclosure can be interconnected to other TFTs by means known in the art to form ICs. TFTs of the disclosure can also be used in various electronic articles such as, for example, RFID tags, backplanes for displays (for use in, for example, personal computers, cell phones, or handheld devices), smart cards, and memory devices.

An array of TFTs comprising at least of one TFT made according to the disclosure can also be made. An array of TFTs can be made, for example, by simultaneously depositing the various transistor layers and features for each TFT onto a transistor substrate in sequence.

TFT's made according to the present disclosure may exhibit desirable performance including, for example, high charge carrier mobility, high ON/OFF current ratio, low OFF current, and small sub-threshold slope. They may also exhibit consistency in these performance characteristics and in threshold voltage and turn on voltage for TFT's fabricated in an identical manner. The TFT's may also exhibit low hysteresis during operation.

SELECT EMBODIMENTS OF THE DISCLOSURE

In a first embodiment, the present disclosure provides an assembly comprising:

a dielectric layer comprising a crosslinked polymeric material having isocyanurate groups, wherein the dielectric layer is free of zirconium oxide particles; and a semiconductor layer in contact with the dielectric layer, wherein the semiconductor layer comprises a non-polymeric organic semiconductor material, and wherein the semiconductor layer is substantially free of electrically insulating polymer.

In a second embodiment, the present disclosure provides an assembly according to the first embodiment, wherein the semiconductor layer is free or substantially free of a polymeric organic semiconductor.

In a third embodiment, the present disclosure provides an assembly according to the first or second embodiment, wherein the crosslinked polymeric material having isocyanurate groups is prepared from a monomer composition comprising a free-radically polymerizable isocyanurate monomer.

In a fourth embodiment, the present disclosure provides an assembly according to the third embodiment, wherein the free-radically polymerizable isocyanurate monomer comprises at least two (meth)acryloyl groups.

In a fifth embodiment, the present disclosure provides an assembly according to the third or fourth embodiment, wherein the monomer composition comprises at least 95 weight percent of the free-radically polymerizable isocyanurate monomer, based on a total weight of free-radically polymerizable compounds in the monomer composition.

In a sixth embodiment, the present disclosure provides an assembly according to the third or fourth embodiments, wherein the monomer composition comprises at least 99 weight percent of the free-radically polymerizable isocyanurate monomer based on a total weight of free-radically polymerizable compounds in the monomer composition.

In a seventh embodiment, the present disclosure provides an assembly according to any one of the third to sixth embodiments, wherein the free-radically polymerizable isocyanurate monomer comprises tris(2-hydroxyethyl)isocyanurate tri (meth)acrylate.

In an eighth embodiment, the present disclosure provides an assembly according to any one of the first to seventh embodiments, wherein the non-polymeric organic semiconductor comprises an acene, heteroacene, or substituted derivative thereof.

In a ninth embodiment, the present disclosure provides an assembly according to the eighth embodiment, wherein said acene, heteroacene, or substituted derivatives thereof includes at least one silylethynyl substituent.

In a tenth embodiment, the present disclosure provides an assembly according to the ninth embodiment, wherein the acene is selected from the group consisting of 6,13-bis(triisopropylsilylethynyl)pentacene, 6,13-bis(isopropenyldiisopropylsilylethynyl)pentacene, 6,13-bis(allyldiisopropylsilylethynyl)pentacene, 6,13-bis(cyclopropyldiisopropylsilylethynyl)pentacene, 6,13-bis((1-methylenepropyl)diisopropylsilylethynyl)pentacene, 6,13-bis(allyldicyclopropylsilylethynyl)pentacene, and 6,13-bis(cyclopropyldiisopropylsilylethynyl)-2,3,9,10-tetramethylpentacene.

In an eleventh embodiment, the present disclosure provides an electronic device comprising an assembly according to any one of the first to tenth embodiments.

In a twelfth embodiment, the present disclosure provides an organic thin film transistor comprising:
 a gate electrode;
 a source electrode;
 a drain electrode;
 the assembly according to any one of the first to tenth embodiments, wherein the gate electrode is adjacent to the dielectric layer, and wherein the source electrode and the drain electrode are adjacent to the semiconductor layer.

In a thirteenth embodiment, the present disclosure provides an assembly according to the twelfth embodiment, wherein the organic thin film transistor is disposed on a polymeric substrate.

In a fourteenth embodiment, the present disclosure provides an organic thin film transistor comprising:
 a gate electrode;
 an inorganic oxide layer;
 a source electrode;
 a drain electrode;
 an assembly according to any one of the first to tenth embodiments, wherein the inorganic oxide layer is sandwiched between the gate electrode and the dielectric layer, and wherein the source electrode and the drain electrode are adjacent to the semiconductor layer.

In a fifteenth embodiment, the present disclosure provides an assembly according to the fourteenth embodiment, wherein the organic thin film transistor is disposed on a polymeric substrate.

Objects and advantages of this disclosure are further illustrated by the following non-limiting examples, but the particular materials and amounts thereof recited in these examples, as well as other conditions and details, should not be construed to unduly limit this disclosure.

EXAMPLES

Unless otherwise noted, all parts, percentages, ratios, etc. in the Examples and the rest of the specification are by weight. Chemicals not specifically sourced below are readily available from standard chemical suppliers such as, for example, the Sigma-Aldrich Chemical Co. of Milwaukee, Wis., or the like.

Materials

| MATERIAL | DESCRIPTION |
| --- | --- |
| IRG184 | 1-hydroxycyclohexylphenyl ketone, a photoinitiator available as IRGACURE 184 from BASF Corp. of Florham Park, New Jersey. |
| Isophorone | 3,5,5-trimethyl-2-cyclohexen-1-one obtained from Alpha Aesar of Ward Hill, Massachusetts. |
| MELAMINE-CO-FORMALDEHYDE SOLUTION | an 84 percent by weight poly(melamine-co-formaldehyde), methylated in 1-butanol solution obtained from Sigma-Aldrich Chemical Company of Milwaukee, Wisconsin, catalog no. 41,856-0. |
| PLASMA CLEANING SYSTEM | Model YES-G1000 obtained from Yield Engineering Systems, Inc. of Livermore, California. |
| PGMEA | 1-methoxy-2-propanol acetate |
| PTFE filter | polytetrafluoroethylene filter with a pore size of 0.2 micron and 25 mm diameter available as ACRODISC CR from Pall Life Sciences of East Hills, New York. |
| PVP | poly(4-vinylphenol) having a molecular weight ($M_W$) of about 20,000 g/mole obtained from Aldrich Chemical Company, catalog no. 43,622-4. |
| SILICON WAFER | a 4-inch (10-cm) diameter n-type silicon wafer with thermal oxide (a silicon <100> wafer highly doped n+ (arsenic) with a resistivity of less than 0.005 ohm-cm, and supplied with a 100 nm thermal oxide ($SiO_2$) on the front surface and coated with 10 nm titanium nitride and 500 nm aluminum on the back surface) obtained from Noel Technologies, Inc. of Campbell, California. |
| A-174 | (3-methacryloxypropyl)trimethoxysilane available as SILQUEST A-174 from Momentive Performance Materials of Wilton, Connecticut. |
| TMPTA | trimethylolpropane triacrylate obtained as SR-351 from Sartomer Co. of Exton, Pennsylvania. |

-continued

| MATERIAL | DESCRIPTION |
|---|---|
| THEITA | tris(2-hydroxyethyl)isocyanurate triacrylate obtained as SR-368 obtained from Sartomer Co. |
| TIPS pentacene | 6,13-bis(triisopropylsilylethynyl)pentacene obtained from Outrider Technologies, LLC of Louisville, Kentucky. |

Preparation of $ZrO_2$—P Resin

Zirconium oxide (zirconia) nanoparticles were prepared using hydrothermal technology, which is generally described in U.S. Pat. No. 7,241,437 (Davidson et al.). A first feedstock that contained a zirconium salt was subjected to a first hydrothermal treatment to form a zirconium-containing intermediate and a byproduct. A second feedstock was prepared by removal of at least some of the acidic byproduct formed during the first hydrothermal treatment. The second feedstock was then subjected to a second hydrothermal treatment to form a zirconia sol that contained the zirconia nanoparticles. The dimensions of the nanoparticles were determined by transmission electron microscopy. The sizes ranged from approximately 1.8 to 11.2 nanometers (nm) with an average particle size of approximately 4.7 nm and standard deviation of 1.3 nm. The aspect ratios of the nanoparticles ranged from approximately 1 to 3.4. The zirconia nanoparticles of the zirconia sol were then surface modified with (3-methacryloxypropyl)trimethoxysilane (A-174) by a process similar to that described in Example 2 of U.S. Pat. No. 7,264,872 (Walker, Jr. et al.), which disclosure is incorporated herein by reference, except that only one silane, A-174, was used. The process resulted in a surface-modified zirconia nanoparticle dispersion. The surface-modified zirconia nanoparticle dispersion was combined with THEITA and IRG184 in isophorone solvent. The combined materials were mixed via magnetic stirring. The mixture was subjected to rotary evaporation using a bath temperature of 65° C. and vacuum (6 mm Hg, 800 Pa) to ensure preferential removal of water, methyl ethyl ketone, and 1-methoxypropan-2-ol. The resulting mixture contained approximately 8.5 weight percent of THEITA and 40.0 weight percent of surface-modified zirconia nanoparticles, 1.5 weight percent of IRG184, and 50.0 weight percent of isophorone. The resulting mixture contained 50 weight percent solids and 40 weight percent of surface-modified zirconia nanoparticles. The mixture was cooled to room temperature and then filtered through a 1.0 micrometer filter into a clean amber glass bottle.

Preparation of Dielectric Formulations

Formulation 1

THEITA (1.2061 g), 0.2099 g of IRG184, and 18.6026 g of n-butylbenzene were placed in an amber glass jar with magnetic stir bar. The jar was capped, and the contents were stirred to provide Formulation 1.

Formulation 2

$ZrO_2$—P resin and isophorone were placed in an amber glass jar with magnetic stir bar. The jar was capped, and the contents were stirred to provide Formulation 2.

Formulation 3

TMPTA (16.9992 g) and 2.9959 g IRG184 were placed in an amber glass jar with magnetic stir bar, the jar capped, and contents stirred until the IRG184 dissolved. A portion of this solution (1.0459 g) and 13.8930 g of n-butylbenzene were added to a separate amber glass jar with magnetic stir bar. The jar was capped, and the contents were stirred to provide Formulation 3.

Formulation 4

PVP (0.6476 g) and 17.1185 g of PGMEA were placed in an amber glass jar with magnetic stir bar. The jar was capped, and the contents were stirred until the PVP dissolved. Then, 0.1924 g of MELAMINE-CO-FORMALDEHYDE SOLUTION was added to the jar, and the contents were stirred to provide Formulation 4.

Formulations 1-4 are summarized in Table 1 (below).

TABLE 1

| FORMULATION | WEIGHT RATIO OF SOLID COMPONENTS | WEIGHT PERCENT SOLIDS | SOLVENT |
|---|---|---|---|
| 1 | 85/15 THEITA/IRG184 | 7 | n-butylbenzene |
| 2 | 17/3/80 THEITA/IRG184/ silane-treated $ZrO_2$ nanoparticles | 30 | isophorone |
| 3 | 85/15 TMPTA/IRG184 | 7 | n-butylbenzene |
| 4 | 80/20 PVP/poly(melamine-co-formaldehyde), methylated | 4.5 | 99.82/0.18 PGMEA/1-butanol |

Preparation of Gate Electrode/Gate Dielectric Substrates

Gate Electrode/Gate Dielectric Substrate 1

A SILICON WAFER was cleaved approximately in half, and then cleaned using an oxygen plasma. The cleaved wafer was treated for 3 minutes in a PLASMA CLEANING SYSTEM using a power setting of 500 W and oxygen flow of 1 standard cubic centimeter per minute (sccm). The resultant plasma-cleaned cleaved wafer was allowed to cool for a few minutes after cleaning to insure it was at room temperature, and then Formulation 1 was spin-coated onto the thermal oxide surface of the wafer at 2000 rpm for 2 minutes at a ramp rate of 432 revolutions per minute/second (rpm/sec). The coated substrate was moved to a nitrogen-purged UV-irradiation chamber (254 nm germicidal lamp) where the coated dielectric was irradiated for 10 minutes (dose=1.2 Joule/$cm^2$). After UV irradiation, the substrate was placed on a hot plate, preheated to 100° C., for 10 minutes. The thickness of the dielectric layer was approximately 66 nm.

Gate Electrode/Gate Dielectric Substrate 2

A SILICON WAFER was cleaned using an oxygen plasma. The wafer was treated for 3 minutes in a PLASMA CLEANING SYSTEM using a power setting of 500 W and oxygen flow of 1 standard cubic centimeter per minute (sccm). The plasma-cleaned wafer was allowed to cool for a few minutes after cleaning to insure it was at room temperature, then Formulation 2 was spin-coated onto the thermal oxide surface of the wafer at 2000 rpm for one minute at a ramp rate of 432 rpm/sec. The coated substrate was placed on a hotplate, which was preheated to 100° C., for 10 minutes. Then the substrate was moved to a nitrogen-purged UV-irradiation chamber (254 nm germicidal lamp) where the coated dielectric was irradiated for 10 minutes (dose=1.2 Joule/cm$^2$). After UV irradiation, the substrate was placed on a hotplate, which was preheated to 100° C., for 10 minutes.

Gate Electrode/Gate Dielectric Substrate 3

A SILICON WAFER was cleaved approximately in half, and then cleaned using an oxygen plasma. The cleaved wafer was treated for 3 minutes in a PLASMA CLEANING SYSTEM using a power setting of 500 W and oxygen flow of one standard cubic centimeter per minute (sccm). The plasma-cleaned cleaved wafer was allowed to cool for a few minutes after cleaning to insure it was at room temperature, then Formulation 3 was spin-coated onto the thermal oxide surface of the wafer at 2000 rpm for 2 minutes at a ramp rate of 432 rpm/sec. The coated substrate was moved to a nitrogen-purged UV-irradiation chamber (254 nm germicidal lamp) where the coated dielectric was irradiated for 10 minutes (dose=1.2 Joule/cm$^2$). After UV irradiation, the substrate was placed on a hotplate, which was preheated to 100° C., for 10 minutes. The thickness of the dielectric layer was approximately 65 nm.

Gate Electrode/Gate Dielectric Substrate 4

A silicon wafer was cleaved in approximately half, and then cleaned using an oxygen plasma. The cleaved wafer was treated for 3 minutes in a PLASMA CLEANING SYSTEM using a power setting of 500 W and oxygen flow of one standard cubic centimeter per minute (sccm). The plasma-cleaned cleaved wafer was allowed to cool for a few minutes after cleaning to insure it was at room temperature, and then Formulation 4 was spin-coated onto the thermal oxide surface of the wafer at 2000 rpm for one minute at a ramp rate of 432 rpm/sec. The coated substrate was placed on a hotplate, which was preheated at 100° C. for 2 minutes. Then the coated substrate was placed on another hotplate, which was preheated to 160° C., for 30 minutes.

Preparation of Organic Semiconductor Solution

Anisole and decane were weighed into a glass bottle, and the bottle capped and shaken to provide a 91/9 w/w anisole/decane solvent blend. TIPS pentacene and the anisole/decane solvent blend were combined in an amber glass jar with magnetic stir bar, the jar capped and covered with a metal can to shield from light, and stirred at room temperature for approximately 48 hours to provide a 1.8 percent by weight TIPS pentacene in anisole/decane solution. The solution was filtered through a PTFE filter prior to dip-coating of the gate electrode/gate dielectric substrates.

Example 1 and Comparative Examples C-1, C-2, and C-3

The gate electrode/gate dielectric substrates were cleaved into approximately 25 mm×35 mm pieces. One piece of each gate electrode/gate dielectric substrate was used to determine the capacitance of the gate dielectric for the substrate and another piece was used in the fabrication of thin film transistors (TFT's). The capacitances of the gate dielectrics were determined as follows. Gold circular pads or electrodes 5 mm in diameter were vapor deposited through a shadow mask using a thermal evaporator onto the gate dielectric surface. The capacitance of the composite gate dielectric (coating plus SiO$_2$) between the heavily doped Si electrode (gate electrode) and gold electrode was measured with an AGILENT E4980A PRECISION LCR METER (Agilent Technologies, Inc. of Santa Clara, Calif.). The capacitance of the 100 nm of thermal oxide (SiO$_2$) was 345 picoFarads/millimeter$^2$ (pF/mm$^2$). The total capacitances of the composite gate dielectrics (coating plus SiO$_2$) for gate electrode/gate dielectric substrates 1, 2, 3, and 4, that were utilized in Example 1, Comparative Example C-1, Comparative Example C-2, and Comparative Example C-3, respectively, are reported in Table 2 (below).

TABLE 2

| | GATE ELECTRODE/ GATE DIELECTRIC SUBSTRATE | DIELECTRIC COATING ON SiO$_2$ | TOTAL CAPACITANCE (pF/mm$^2$) |
|---|---|---|---|
| EXAMPLE 1 | 1 | THEITA | 188.8 |
| COMPARATIVE EXAMPLE C-1 | 2 | ZrO$_2$ in THEITA | 170.0 |
| COMPARATIVE EXAMPLE C-2 | 3 | TMPTA | 192.9 |
| COMPARATIVE EXAMPLE C-3 | 4 | PVP | 165.1 |

Thin film transistors (TFT's) were fabricated as follows. Approximately 5 mL of the ORGANIC SEMICONDUCTOR SOLUTION was placed in a dip-coating tank (approximately 50 mm long, 5 mm wide, and 30 mm high). One piece of each gate electrode/gate dielectric substrate was dip-coated in the ORGANIC SEMICONDUCTOR SOLUTION at a draw rate of approximately 3 millimeters per minute using a dip coating apparatus available as NIMA D1L from Nima Technology Ltd. of Coventry, United Kingdom. Each sample was allowed to dry at room temperature. Gold source and drain electrodes (approximately 80-100 nm thick) were vapor deposited through a shadow mask using a thermal evaporator, thus forming transistors with a bottom gate, top contact architecture. Source and drain electrodes were rectangular and parallel to each other, and were oriented with the long dimension of the electrodes, which corresponded to the channel width, perpendicular to the dip coating direction or dip axis. Source and Drain contacts were sized such that the width of the transistor is approximately 1000 micrometers, and the channel length was approximately 100 micrometers.

The mobilities of the TFTs were measured as follows. Ten TFT'S were measured consecutively for each Example and each Comparative Example. The TFT's were randomly chosen, except for the stipulation that the selected TFT's were not adjacent to the edge of the substrate. The saturation field effect mobility (μ) was determined using two Source Measure Units (Model 2400 from Keithley Instruments, Inc. of Cleveland, Ohio) under ambient conditions. The devices were placed on an S-1160 Series probe station and probes connected using S-725-PRM manipulators (both available from Signatone Corp. of Gilroy, Calif.). The drain to source bias voltage (V$_{DS}$) was held at −40 V, while the gate to source bias voltage (V$_{GS}$) was incremented over the range +10 V to −40 V in 1 V steps. The drain to source current (I$_{DS}$) was measured as a function of V$_{GS}$ from +10V to −40V at a constant V$_{DS}$ of −40V. The saturation field effect mobility (μ) was calculated from the slope of the linear portion of the plot of the square root of I$_{DS}$ versus V$_{GS}$ using the equation:

$$I_{DS} = \mu W C (V_{GS} - V_t)^2 \div 2L$$

in which the saturated field effect mobility (μ) is related to the slope (m) of the plot of the square root of $I_{DS}$ versus $V_{GS}$ by the following equation:

$$\mu = 2\left(\frac{m^2 L}{WC}\right)$$

wherein C is the specific capacitance of the gate dielectric (i.e., the total capacitance given in Table 2), W is the channel width, and L is the channel length. Using the plot of the square root of $I_{DS}$ versus $V_{GS}$ curve, the extrapolation of the straight-line fit of the linear portion to the X-axis (i.e., where the square root of $I_{DS}$ equals zero) provided the X-axis intercept, which was taken as the threshold voltage ($V_t$). In addition, plotting $I_{DS}$ (using a log-scale) as a function of $V_{GS}$ generated a curve where a straight line fit was drawn along a portion of the curve containing $V_t$. The sub-threshold slope (S) is defined to be the inverse of the slope of this line. The OFF current was taken as the value of $I_{DS}$ immediately preceding the exponential and continuous rise of $I_{DS}$. The ON/OFF current ratio was taken as the ratio of the maximum $I_{DS}$ value from the $I_{DS}$ versus $V_{GS}$ measurement to the OFF current. All devices were measured under ambient conditions which were approximately 25° C., 31% Relative Humidity (R.H.) for Example 1, Comparative Example C-2, and Comparative Example C-3, and approximately 24° C., 22% R.H. for Comparative Example C-1.

After the 10 TFT's from a sample were measured, 2 additional TFT's from the sample were measured in the same fashion, except that $V_{GS}$ was swept from +10V to −40V (forward sweep) and then back to +10V (reverse sweep) in 1V steps in order to evaluate device hysteresis. The earliest $V_{GS}$ on the reverse sweep in which $I_{DS}$ deviated by more than 5% from its value obtained at that same voltage on the forward sweep is defined here as the Divergence Voltage. All devices were measured under ambient conditions which were approximately 25° C., 31% Relative Humidity (R.H.) for Example 1, Comparative Example C-2, and Comparative Example C-3, and approximately 24° C., 22% R.H. for Comparative Example C-1.

Table 3 (below) reports the performance characteristics for Example 1 and Comparative Examples C-1, C-2, and C-3.

TABLE 3

|  | EXAMPLE 1 | COMP. EX. C-1 | COMP. EX. C-2 | COMP. EX. C-3 |
| --- | --- | --- | --- | --- |
| Ave. Mobility (cm²/V-s) | 0.288 | 0.00319 | 0.233 | 0.323 |
| St. Dev. | 0.041 | 0.00135 | 0.018 | 0.022 |
| Min. | 0.202 | 0.00173 | 0.206 | 0.285 |
| Max. | 0.343 | 0.00551 | 0.264 | 0.347 |
| Ave. ON/OFF Current Ratio | 2.38 × 10⁵ | 3.22 × 10³ | 5.99 × 10⁴ | 9.34 × 10⁴ |
| St. Dev. | 1.17 × 10⁵ | 2.11 × 10³ | 5.99 × 10⁴ | 6.47 × 10⁴ |
| Min. | 1.08 × 10⁵ | 1.41 × 10³ | 2.06 × 10⁴ | 2.76 × 10⁴ |
| Max. | 5.14 × 10⁵ | 8.44 × 10³ | 9.75 × 10⁴ | 1.91 × 10⁵ |
| Ave. OFF Current (pA) | 185 | 158 | 812 | 535 |
| St. Dev. | 62 | 71 | 459 | 377 |
| Min. | 108 | 41 | 138 | 149 |
| Max. | 309 | 268 | 1470 | 1250 |
| Ave. S, Subthreshold Slope (V/decade) | 1.07 | 2.30 | 1.93 | 1.99 |
| St. Dev. | 0.17 | 0.50 | 0.44 | 0.19 |
| Min. | 0.91 | 1.79 | 1.10 | 1.57 |
| Max. | 1.48 | 3.55 | 2.37 | 2.23 |
| Ave. $V_t$, Threshold Voltage (V) | −5.00 | 4.90 | −5.52 | −3.96 |
| St. Dev. | 0.29 | 0.73 | 0.15 | 2.41 |
| Min. | −5.50 | 2.92 | −5.79 | −8.83 |
| Max. | −4.43 | 5.57 | −5.29 | −1.79 |
| Ave. $V_{ON}$, Turn On Voltage (V) | 0.01 | 0.89 | 0.26 | 2.35 |
| St. Dev. | 0.41 | 0.88 | 0.29 | 1.97 |
| Min. | −0.79 | −0.68 | 0.11 | −1.81 |
| Max. | 0.29 | 2.14 | 1.07 | 4.13 |
| Divergence Voltages (V) for 2 TFT's | −2.75, −3.73 | −12.55, −10.59 | −23.33, −18.43 | −40.00, −40.00 |

Figure 3:
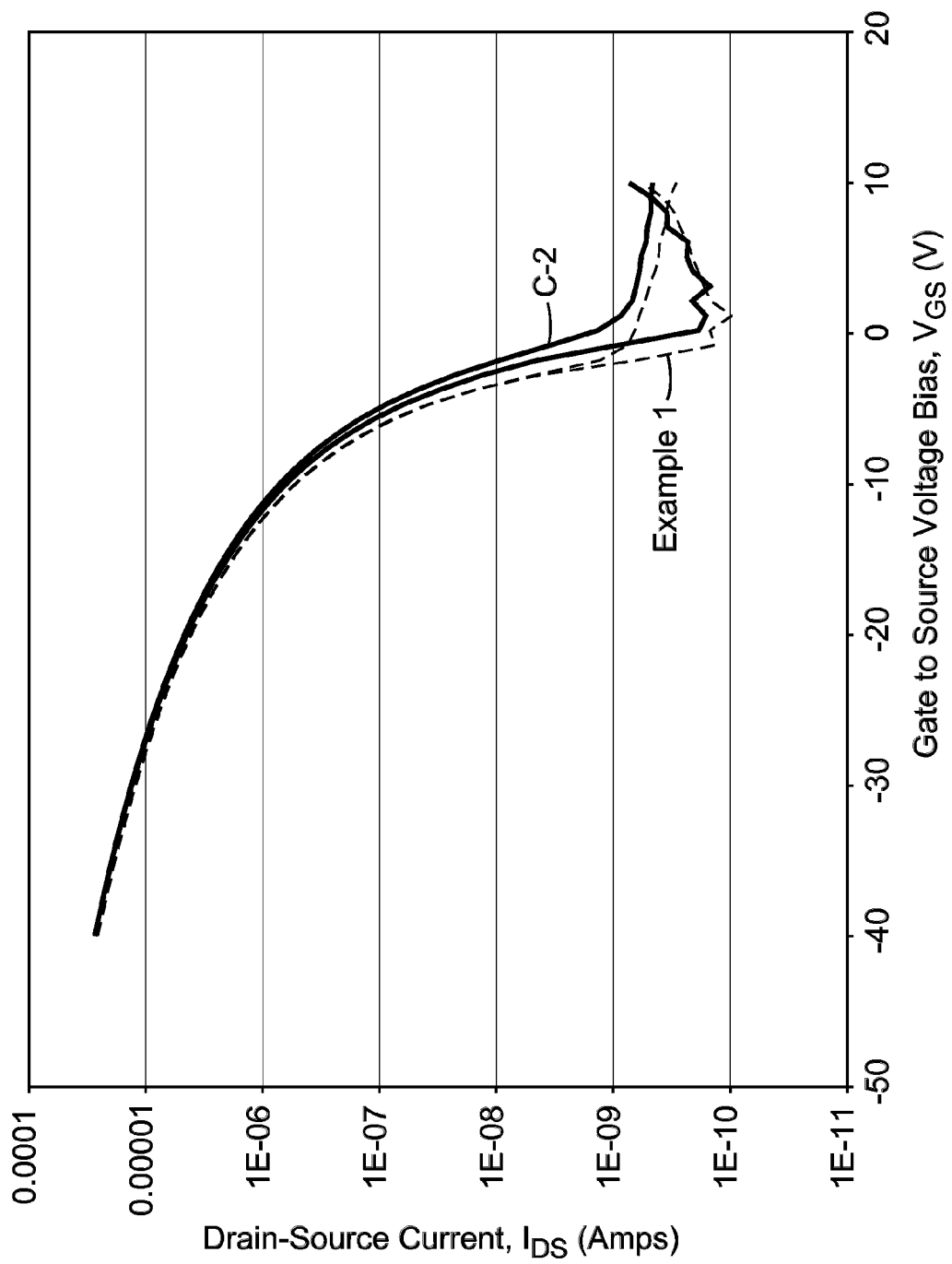
FIG. 3 is a plot of Drain source current vs. Gate source voltage bias for Example 1 and Comparative Example C-2.

FIG. 3 shows $I_{DS}$ of the $V_{GS}$ during both the forward and reverse sweeps of $V_{GS}$ for the TFT of Example 1 which had a Divergence Voltage of −2.75 V and the TFT of Comparative Example C-2 which had a Divergence Voltage of −18.43 V.

Various modifications and alterations of this disclosure may be made by those skilled in the art without departing from the scope and spirit of this disclosure, and it should be understood that this disclosure is not to be unduly limited to the illustrative embodiments set forth herein.

What is claimed is:

1. An organic thin film transistor comprising:
   a gate electrode disposed on a transistor substrate;
   a source electrode;
   a drain electrode;
   a dielectric layer comprising a crosslinked polymeric material having isocyanurate groups, wherein the dielectric layer is free of zirconium oxide particles, wherein the source and drain electrodes are disposed on the dielectric layer, and wherein the dielectric layer is disposed on the gate electrode or an inorganic layer sandwiched between the gate electrode and the dielectric layer; and
   a semiconductor layer disposed on the dielectric layer, the source electrode, and the drain electrode, wherein the semiconductor layer comprises a non-polymeric organic semiconductor material, and wherein the semiconductor layer is substantially free of electrically insulating polymer.

2. An organic thin film transistor comprising:
   a gate electrode;
   a source electrode;
   a drain electrode;
   a dielectric layer comprising a crosslinked polymeric material having isocyanurate groups, wherein the dielectric layer is free of zirconium oxide particles; and
   a semiconductor layer in contact with the dielectric layer, wherein the semiconductor layer comprises a non-polymeric organic semiconductor material, and wherein the semiconductor layer is substantially free of electrically insulating polymer, wherein the semiconductor layer is disposed on a transistor substrate, wherein the source and drain electrodes are disposed on the semiconductor layer, wherein the gate electrode is disposed on the dielectric layer or on an inorganic oxide layer sandwiched between the gate electrode and the dielectric layer.

3. An organic thin film transistor comprising:
a gate electrode disposed on a transistor substrate;
a source electrode;
a drain electrode;
a dielectric layer comprising a crosslinked polymeric material having isocyanurate groups, wherein the dielectric layer is free of zirconium oxide particles, wherein the source and drain electrodes are disposed on the dielectric layer, and wherein the dielectric layer is disposed on the gate electrode or an inorganic layer sandwiched between the gate electrode and the dielectric layer; and
a semiconductor layer disposed on the dielectric layer, wherein the semiconductor layer comprises a non-polymeric organic semiconductor material, and wherein the semiconductor layer is substantially free of electrically insulating polymer, and wherein the source and drain electrodes are disposed on the semiconductor layer.

4. An organic thin film transistor comprising:
source and drain electrodes disposed on a transistor substrate;
a semiconductor layer disposed on the source electrode and drain electrodes and the transistor substrate, wherein the semiconductor layer comprises a non-polymeric organic semiconductor material, and wherein the semiconductor layer is substantially free of electrically insulating polymer;
a dielectric layer disposed on the semiconductor layer, the dielectric layer comprising a crosslinked polymeric material having isocyanurate groups, wherein the dielectric layer is free of zirconium oxide particles; and
a gate electrode disposed on:
  the dielectric layer; or
  an inorganic oxide layer sandwiched between the gate electrode and the dielectric layer.

* * * * *